(12) United States Patent
Lee

(10) Patent No.: US 8,878,202 B2
(45) Date of Patent: Nov. 4, 2014

(54) DISPLAY APPARATUS AND METHOD OF FABRICATING THE SAME

(75) Inventor: Kyung-Jun Lee, Cheonan-si (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 271 days.

(21) Appl. No.: 13/280,892

(22) Filed: Oct. 25, 2011

(65) Prior Publication Data
US 2012/0235170 A1 Sep. 20, 2012

(30) Foreign Application Priority Data
Mar. 15, 2011 (KR) .................. 10-2011-0023021

(51) Int. Cl.
*H01L 29/18* (2006.01)
*H01J 11/48* (2012.01)
*H01L 51/52* (2006.01)
*H01J 9/24* (2006.01)

(52) U.S. Cl.
CPC ............. *H01L 51/5246* (2013.01); *H01J 11/48* (2013.01); *H01J 9/24* (2013.01)

USPC ............................................. 257/88; 257/99

(58) Field of Classification Search
USPC ..................................................... 257/88, 99
See application file for complete search history.

(56) References Cited

U.S. PATENT DOCUMENTS
8,125,415 B2 * 2/2012 Koyama et al. .................. 345/76

FOREIGN PATENT DOCUMENTS
| KR | 10-2006-0112948 | 11/2006 |
| KR | 10-0843132 | 6/2008 |
| KR | 10-0903622 | 6/2009 |

* cited by examiner

*Primary Examiner* — Douglas Menz
(74) *Attorney, Agent, or Firm* — Robert E. Bushnell, Esq.

(57) ABSTRACT

A display apparatus comprises a first substrate, a second substrate separated from the first substrate and facing the first substrate, and a first sealing portion interposed between the first substrate and the second substrate, wherein the first substrate comprises a first region overlapped by the second substrate and a second region not overlapped by the second substrate, and the first sealing portion is situated on a boundary between the first region and the second region and comprises one or more injection holes.

23 Claims, 12 Drawing Sheets

DISPLAY APPARATUS AND METHOD OF FABRICATING THE SAME

CLAIM OF PRIORITY

This application makes reference to, incorporates the same herein, and claims all benefits accruing under 35 U.S.C. §119 from an application earlier filed in the Korean Intellectual Property Office on the 15 Mar. 2011 and there duly assigned Serial No. 10-2011-0023021.

BACKGROUND OF THE INVENTION

1. Field of the Invention

The present invention relates to a display apparatus and a method of fabricating the same.

2. Description of the Related Art

Organic electroluminescence displays are one of the most widely used types of displays. Organic electroluminescence displays have self light-emitting characteristics and can be reduced in thickness and weight since they do not require a light source unlike liquid crystal displays. In addition, organic electroluminescence displays exhibit superior characteristics, such as low power consumption, high luminance and high response speed. Due to these characteristics, organic electroluminescence displays are drawing attention as next-generation displays for portable electronic devices.

Generally, an organic electroluminescence display includes a first substrate having organic light-emitting diodes (OLEDs), a second substrate facing the first substrate and protecting the OLEDs, and a sealing portion for bonding and sealing the first substrate and the second substrate.

SUMMARY OF THE INVENTION

In an organic electroluminescence display, empty spaces may exist between the first substrate and the second substrate which are not bonded together by the sealing portion. These empty spaces may weaken the mechanical strength of the organic electroluminescence display.

The present invention provides a display apparatus with increased mechanical strength.

The present invention also provides a method of fabricating a display apparatus with increased mechanical strength.

However, aspects of the present invention are not restricted to the ones set forth herein. The above and other aspects of the present invention will become more apparent to one of ordinary skill in the art to which the present invention pertains by referencing the detailed description of the present invention given below.

According to an aspect of the present invention, a display apparatus comprises: a first substrate; a second substrate separated from the first substrate and facing the first substrate; and a first sealing portion interposed between the first substrate and the second substrate; wherein the first substrate comprises a first region overlapped by the second substrate and a second region not overlapped by the second substrate; and wherein the first sealing portion is situated on a boundary between the first region and the second region, and comprises one or more injection holes.

According to another aspect of the present invention, a display apparatus comprises: a first substrate; a second substrate disposed above the first substrate so as to overlap at least part of the first substrate; and a first sealing portion disposed on the first substrate and having one or more injection holes; wherein an outer surface of the first sealing portion is aligned with a side surface of the second substrate in a first direction.

According to still another aspect of the present invention, a method of fabricating a display apparatus comprises: preparing a first substrate and a second substrate on which a cutting line and a first sealing portion extending along the cutting line and having one or more injection holes are formed; placing the second substrate so as to overlap at least part of the first substrate; and cutting the second substrate and the first sealing portion along the cutting line.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
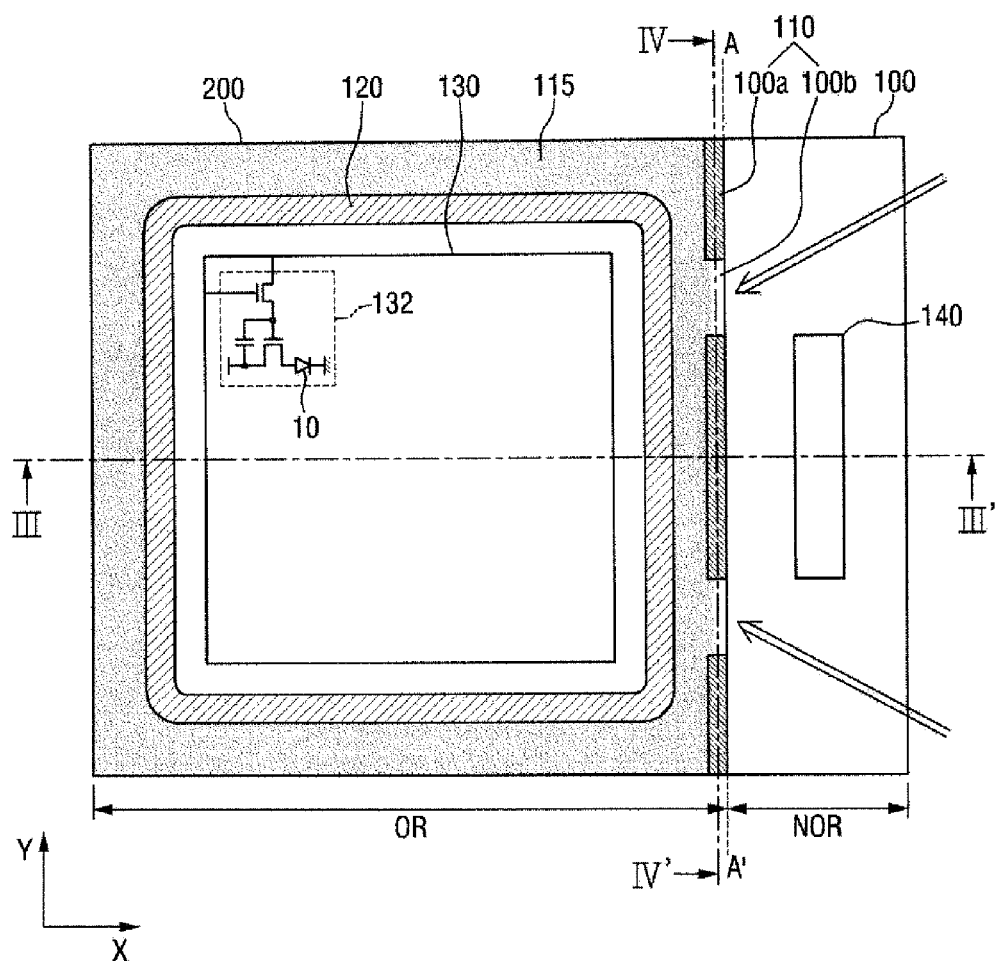
FIG. 1 is a conceptual plan view of a display apparatus according to an exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of elements may be exaggerated for clarity. Like reference numerals refer to like elements throughout the specification. As used herein, the term "and/or" includes any and all combinations of one or more of the associated listed items.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "made of," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning which is consistent with their meaning in the context of the relevant art, and will not be interpreted in an idealized or overly formal sense unless expressly so defined herein.

Hereinafter, a display apparatus according to an exemplary embodiment of the present invention will be described with reference to FIGS. 1 thru 4.

Figure 2:
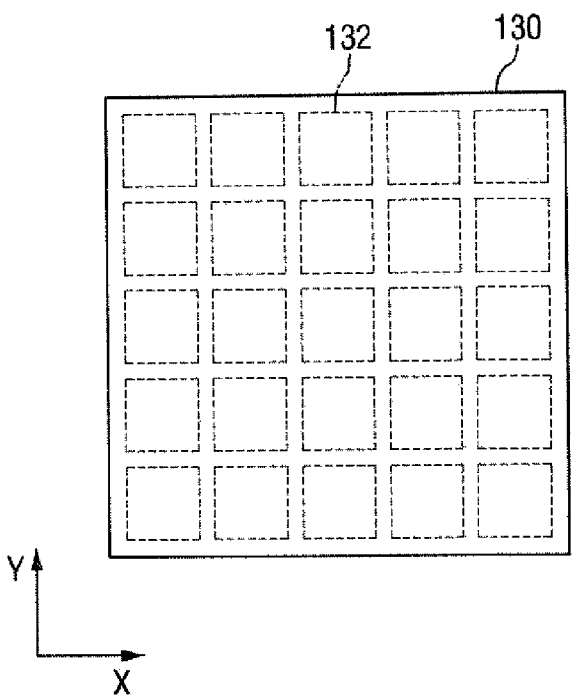
FIG. 2 is a view illustrating a display region shown in FIG. 1.
Figure 3:
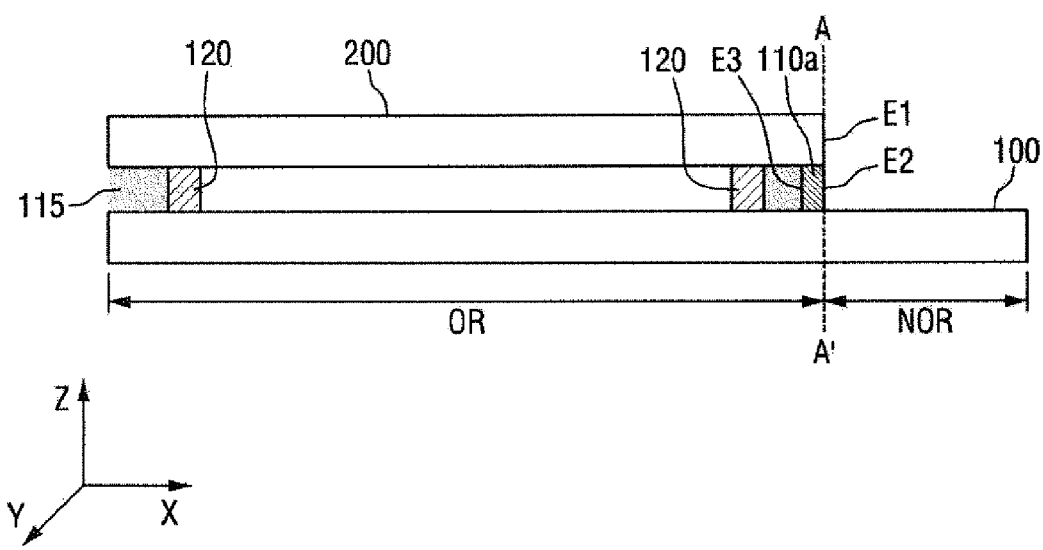
FIG. 3 is a cross-sectional view taken along the line III-III' of FIG. 1.
Figure 4:
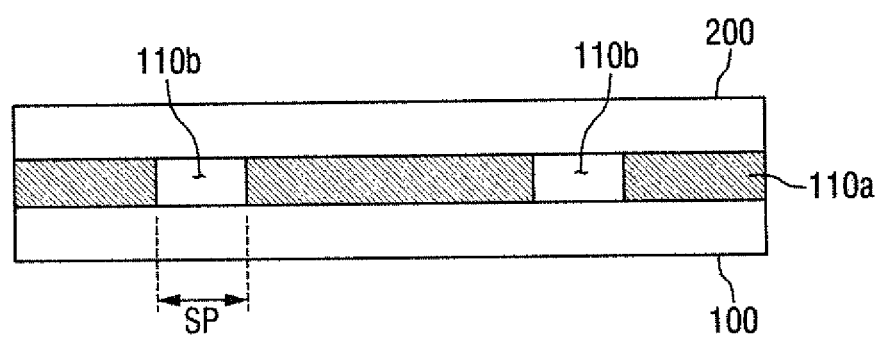
FIG. 4 is a cross-sectional view taken along the line IV-IV' of FIG. 1.

FIG. 1 is a conceptual plan view of a display apparatus according to an exemplary embodiment of the present invention, FIG. 2 is a view illustrating a display region shown in FIG. 1, FIG. 3 is a cross-sectional view taken along the line III-III' of FIG. 1, and FIG. 4 is a cross-sectional view taken along the line IV-IV' of FIG. 1.

Referring to FIGS. 1 thru 4, the display apparatus according to the current exemplary embodiment includes a first substrate 100, a second substrate 200, and a first sealing portion 110.

The first substrate 100 and the second substrate 200 are separated from each other and face each other. The second substrate 200 is placed above the first substrate 100 so as to overlap at least part of the first substrate 100. The first substrate 100 may be divided into a first region OR overlapped by the second substrate 200 and a second region NOR not overlapped by the second substrate 200.

The first region OR of the first substrate 100 may include the display region 130 having a plurality of pixel regions 132. The pixel regions 132 of the display region 130 may be arranged in a grid in a first direction Y and a third direction X, as shown in FIG. 2. However, the arrangement of the pixel regions 132 shown in FIG. 2 is merely an example, and the pixel regions 132 can be arranged in the display region 130 in various forms other than the form shown in FIG. 2.

A display circuit may be formed in each pixel region 132. The display circuit may include at least one light-emitting device 10. The light-emitting device 10 may be, for example, an organic light-emitting diode (OLED). Therefore, at least one OLED is disposed in each pixel region 132.

A peripheral circuit 140 may be disposed in the second region NOR of the first substrate 100. The peripheral circuit 140 may be a circuit providing various control signals to the display circuit formed in each pixel region 132. For example, the peripheral circuit 140 may be a driver circuit which provides a driving signal for driving at least one light-emitting device 10 formed in each pixel region 132.

The first sealing portion 110 is placed on a surface of the first substrate 100 which faces the second substrate 200, and is thus interposed between the first substrate 100 and the second substrate 200. The first sealing portion 110 prevents the shock created when the second substrate 200 is cut from being delivered to the first substrate 100, thereby avoiding defects such as cracks.

The first sealing portion 110 may be situated on a boundary A-A' between the first region OR and the second region NOR of the first substrate 100. In some embodiments, at least part of the first sealing portion 110 may extend in the first direction Y (see FIGS. 1 thru 3) parallel to the boundary A-A' between the first region OR and the second region NOR.

An outer surface E2 of the first sealing portion 110 may be aligned with a side surface E1 of the second substrate 200 in a second direction Z (see FIG. 3). An inner surface E3 of the first sealing portion 110 may be located within the first region OR.

The first sealing portion 110 includes one or more injection holes 110b. That is, as shown in FIGS. 1 thru 4, the first sealing portion 110 may include a plurality of sealing patterns 110a separated from each other. Spaces SP between the sealing patterns 110a may define the injection holes 110b, respectively. The function and role of the injection holes 110b will be described in detail later.

In some embodiments of the present invention, the display apparatus may further include a stiffener 115. The stiffener 115 may be disposed between the first substrate 100 and the second substrate 200 in the first region OR of the first substrate 100. The stiffener 115 can increase the adhesion of the first substrate 100 to the second substrate 200.

Despite the presence of the first sealing portion 110, the stiffener 115 can be placed so as to contact the first sealing portion 110. Specifically, referring to FIGS. 1 and 3, the first sealing portion 110 is not disposed at side surfaces of the second substrate 200, excluding the side surface E1. Therefore, it is easy to inject the stiffener 115 directly into the space between the first and second substrates 100 and 200, respectively, from these side surfaces. On the other hand, the first sealing portion 110 formed at the side surface E1 of the second substrate 200 may hinder the stiffener 115 from being injected directly into the space between the first and second substrates 100 and 200, respectively, from the side surface E1. However, since the first sealing portion 110 includes one or more injection holes 110b as described above, the stiffener 115 can be injected directly into the space between the first and second substrates 100 and 200, respectively, through the injection holes 110b from the side surface E1 of the second substrate 200, as indicated by arrows in FIG. 1.

The stiffener 115, injected in a direction from the second region NOR toward the first region OR through the injection holes 110b of the first sealing portion 110, may contact the sealing patterns 110a or the injection holes 110b. Furthermore, the stiffener 115 may fill at least part of each of the injection holes 110b when it is injected through the injection holes 110b. Since the stiffener 115 can be injected through the injection holes 110b of the first sealing portion 110, it can be easily and evenly injected into four sides of the space between the first and second substrates 100 and 200, respectively. The injected stiffener 115 increases the adhesion between the first substrate 100 and the second substrate 200.

In some embodiments of the present invention, the display apparatus may further include a second sealing portion 120. Like the first sealing portion 110, the second sealing portion 120 is placed on the surface of the first substrate 100 which faces the second substrate 200, and is thus interposed between the first substrate 100 and the second substrate 200. The second sealing portion 120 may surround the display region 130. The second sealing portion 120 may be situated close to the inner surface E3 of the first sealing portion 110.

The second sealing portion 120 may be in the shape of a square which surrounds the display region 130. At least one side of the second sealing portion 120 may be parallel to the first sealing portion 110.

The stiffener 115 may be disposed outside the second sealing portion 120. That is, the stiffener 115 may be disposed inside the first region OR of the first substrate 100, but may be disposed outside the second sealing portion 120. The stiffener 115 may be disposed between the first sealing portion 110 and the second sealing portion 120.

Figure 5:
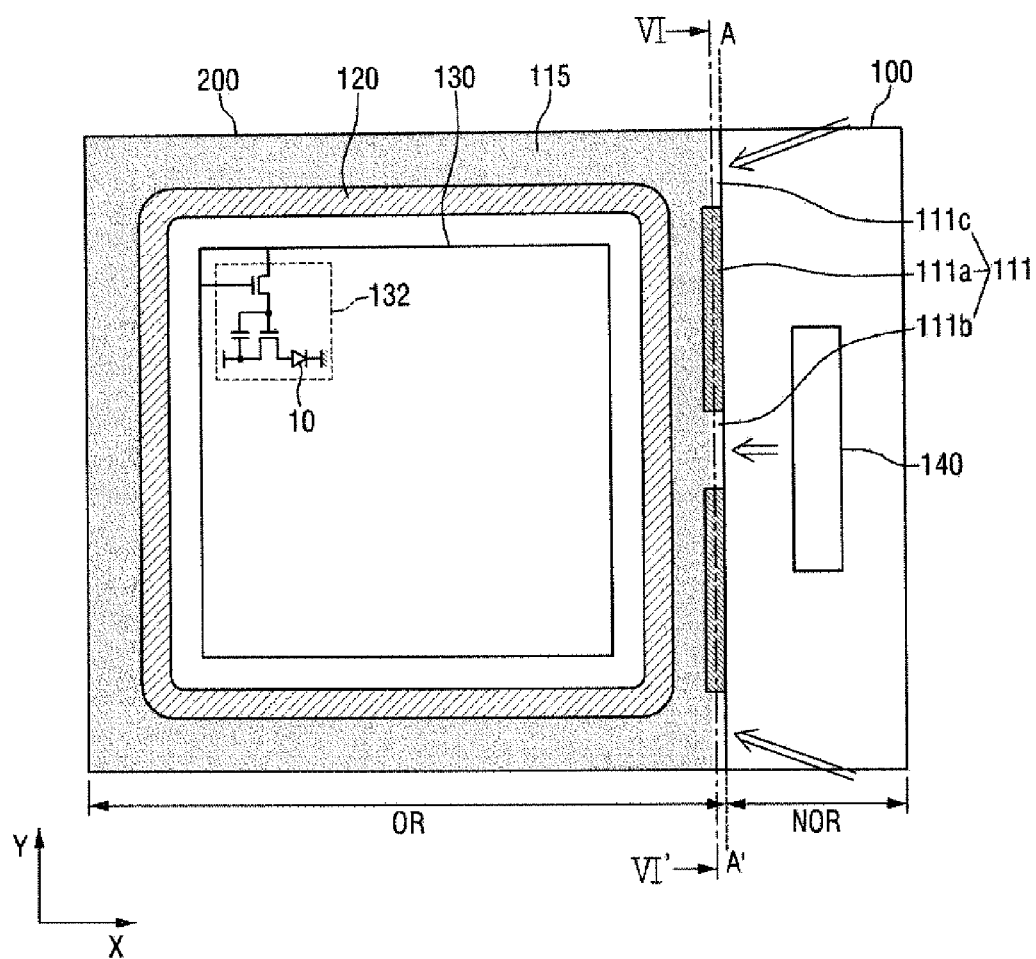
FIG. 5 is a conceptual plan view of a display apparatus according to another exemplary embodiment of the present invention.
Figure 6:
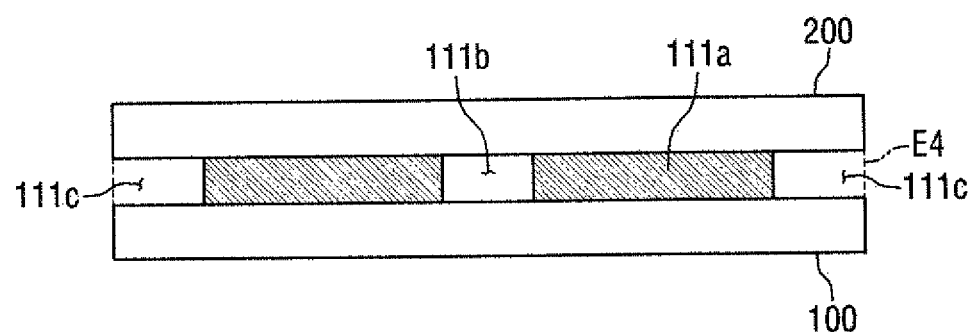
FIG. 6 is a cross-sectional view taken along the line VI-VI' of FIG. 5.

FIG. 5 is a conceptual plan view of a display apparatus according to another exemplary embodiment of the present invention, and FIG. 6 is a cross-sectional view taken along the line VI-VI' of FIG. 5.

Referring to FIGS. 5 and 6, the display apparatus according to the current exemplary embodiment is different from the display apparatus according to the previous exemplary embodiment of FIGS. 1 thru 4 in that one or more injection holes 111b or 111c are formed at one or more of both ends of a boundary between a first substrate 100 and a second substrate 200. Specifically, a first sealing portion 111 includes a plurality of sealing patterns 111a and injection holes 111b and 111c. In this regard, the injection hole 111b may be defined by a space between the sealing patterns 111a separated from each other. On the other hand, the injection holes 111c may be partially defined by at least one of a surface of the first substrate 100 and a surface of the second substrate 200 which are exposed by the first sealing portion 111. That is, in the current exemplary embodiment, each of the injection holes 111c may be defined by a side surface of one of the sealing patterns 111a, the surfaces of the first and second substrates 100 and 200, respectively, which are exposed by the first sealing portion 111, and one of extended surfaces E4 which extend from both side surfaces of the first substrate 100 to both corresponding side surfaces of the second substrate 200. The injection holes 111b and 111c facilitate the injection of a stiffener 115 as described above.

Figure 7:
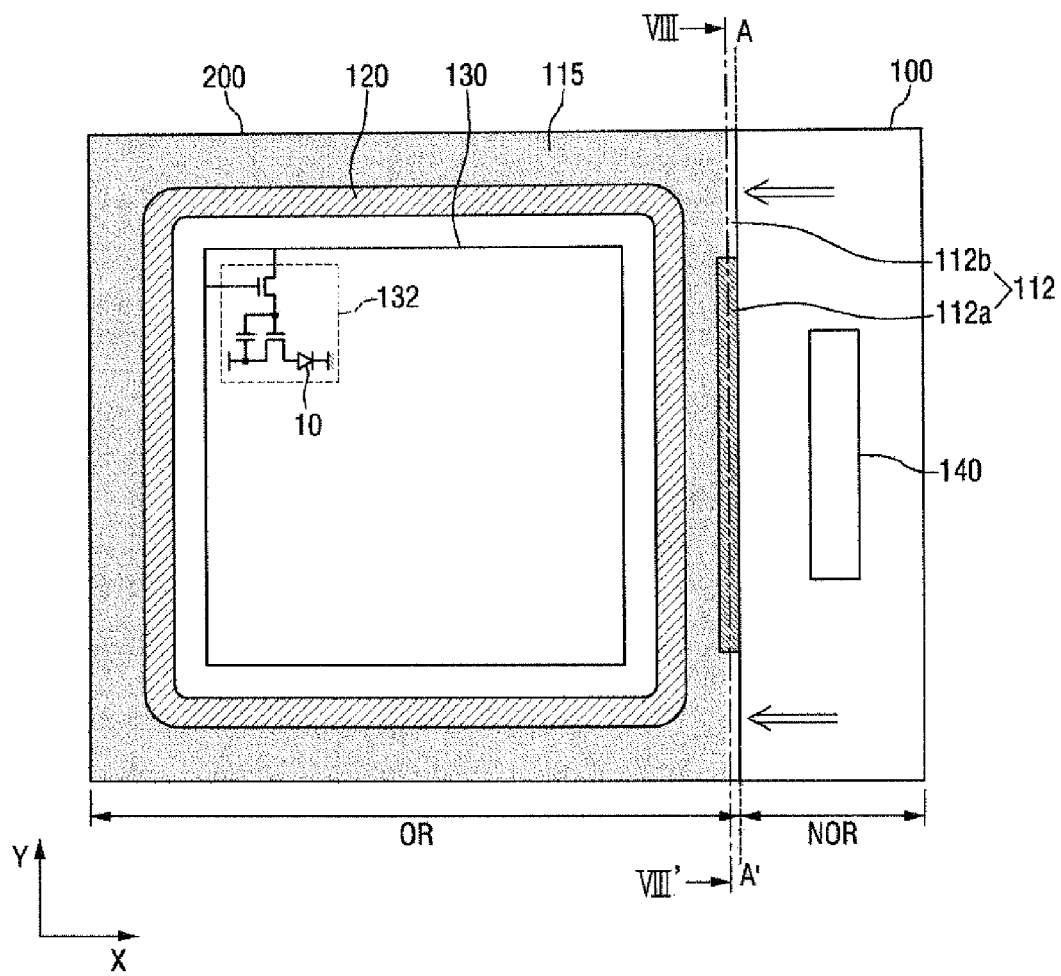
FIG. 7 is a conceptual plan view of a display apparatus according to another exemplary embodiment of the present invention.
Figure 8:
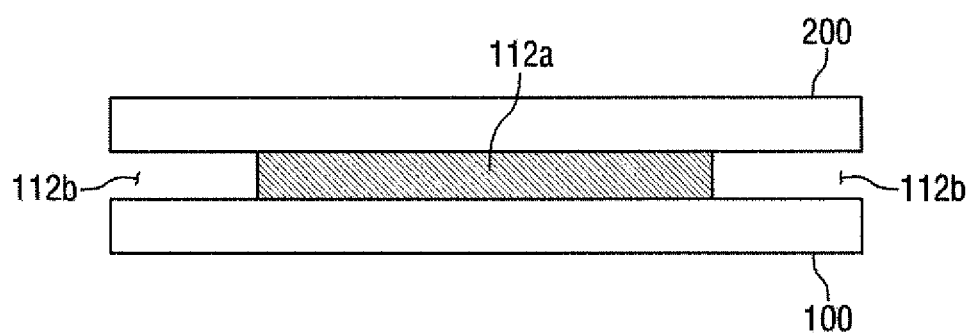
FIG. 8 is a cross-sectional view taken along the line VIII-VIII' of FIG. 7.

FIG. 7 is a conceptual plan view of a display apparatus according to another exemplary embodiment of the present invention, and FIG. 8 is a cross-sectional view taken along the line VIII-VIII' of FIG. 7.

Referring to FIGS. 7 and 8, the display apparatus according to the current exemplary embodiment is different from the display apparatuses according to the previous exemplary embodiments in that a sealing pattern 112a of a first sealing portion 112 is formed as an undivided single pattern, and in that one or more injection holes 112b of the first sealing portion 112 are formed at one or more of both ends of a boundary between a first substrate 100 and a second substrate 200.

Each of the injection holes 112b may be defined by a side surface of the sealing pattern 112a, surfaces of the first and second substrates 100 and 200, respectively, which are exposed by the first sealing portion 112, and one of extended surfaces which extend from both side surfaces of the first substrate 100 to both corresponding side surfaces of the second substrate 200. The injection holes 112b facilitate the injection of a stiffener 115 as described above.

Figure 9:
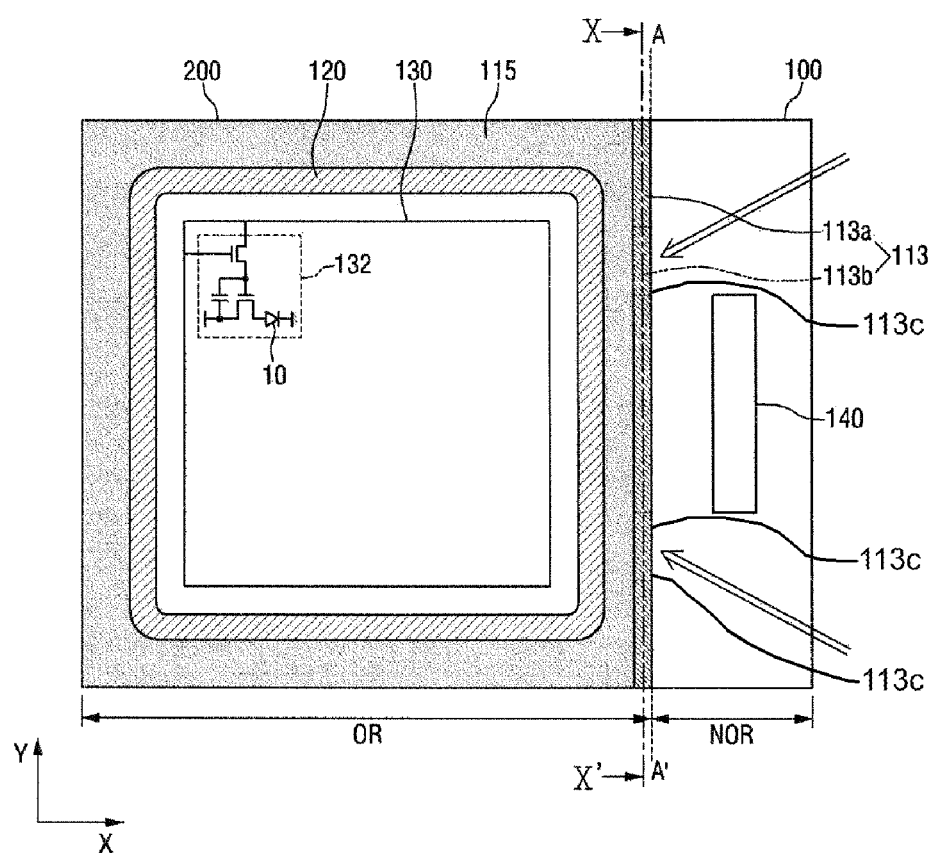
FIG. 9 is a conceptual plan view of a display apparatus according to another exemplary embodiment of the present invention.
Figure 10:
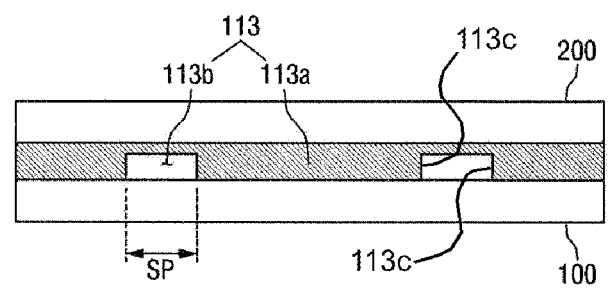
FIG. 10 is a cross-sectional view taken along the line X-X' of FIG. 9.

FIG. 9 is a conceptual plan view of a display apparatus according to another exemplary embodiment of the present invention, and FIG. 10 is a cross-sectional view taken along the line X-X' of FIG. 9.

Referring to FIGS. 9 and 10, the display apparatus according to the current exemplary embodiment is different from the display apparatuses according to the previous exemplary embodiments in that one or more injection holes 113b are formed inside a sealing pattern 113a of a first sealing portion 113 which is formed as a single undivided pattern.

Specifically, the injection holes 113b may be trenches cut into a surface of the sealing pattern 113a. That is, the injection holes 113b are disposed inside the sealing pattern 113a and defined by a surface of the first substrate 100 which is exposed by the first sealing portion 113 and inner sidewalls of the sealing pattern 113a with spaced-apart sidewalls of injection holes 113b extending only partially between the first and second substrates 100, 200, as show, by FIG. 10.

To form the first sealing portion 113 as shown in FIG. 10, the sealing pattern 113a having different heights from a surface of the second substrate 200 may be continuously formed on the second substrate 200 in a first direction (e.g., a Y direction). Although not shown in the drawing, the first sealing portion 113 may also be formed by continuously forming the sealing pattern 113a, which has different heights relative to a surface of the first substrate 100, on the first substrate 100 in the first direction (e.g., the Y direction). In this case, each of the injection holes 113b may be defined by a surface of the second substrate 200 which is exposed by the first sealing portion 113 and the inner sidewalls of the sealing pattern 113a. The injection holes 113b facilitates the injection of a stiffener 115 as described above.

Figure 11:
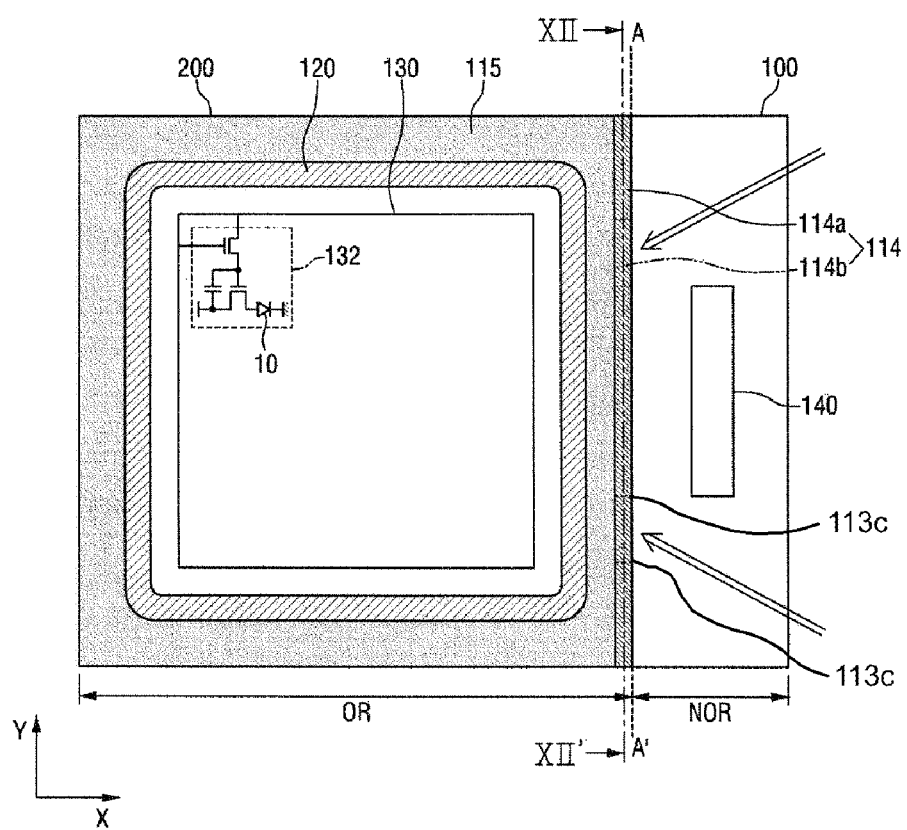
FIG. 11 is a conceptual plan view of a display apparatus according to another exemplary embodiment of the present invention.
Figure 12:
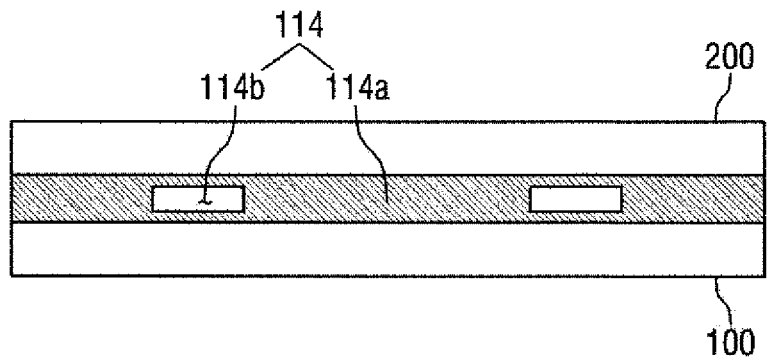
FIG. 12 is a cross-sectional view taken along the line XII-XII' of FIG. 11.

FIG. 11 is a conceptual plan view of a display apparatus according to another exemplary embodiment of the present invention, and FIG. 12 is a cross-sectional view taken along the line XII-XII' of FIG. 11.

Referring to FIGS. 11 and 12, the display apparatus according to the current exemplary embodiment is different from the display apparatuses according to the previous exemplary embodiments in that one or more openings are included inside a sealing pattern 114a of a first sealing portion 114 which is formed as an undivided single pattern. In this regard, the openings may serve as injection holes 114b.

The openings (i.e., the injection holes 114b) may be formed inside the sealing pattern 114a using various methods. The injection holes 114b may be formed after the sealing pattern 114a is formed, or may be formed in the process of forming the sealing pattern 114b. The injection holes 114b facilitate the injection of a stiffener 115 as described above.

Hereinafter, a method of fabricating a display apparatus according to an exemplary embodiment of the present invention will be described.

Figure 13:
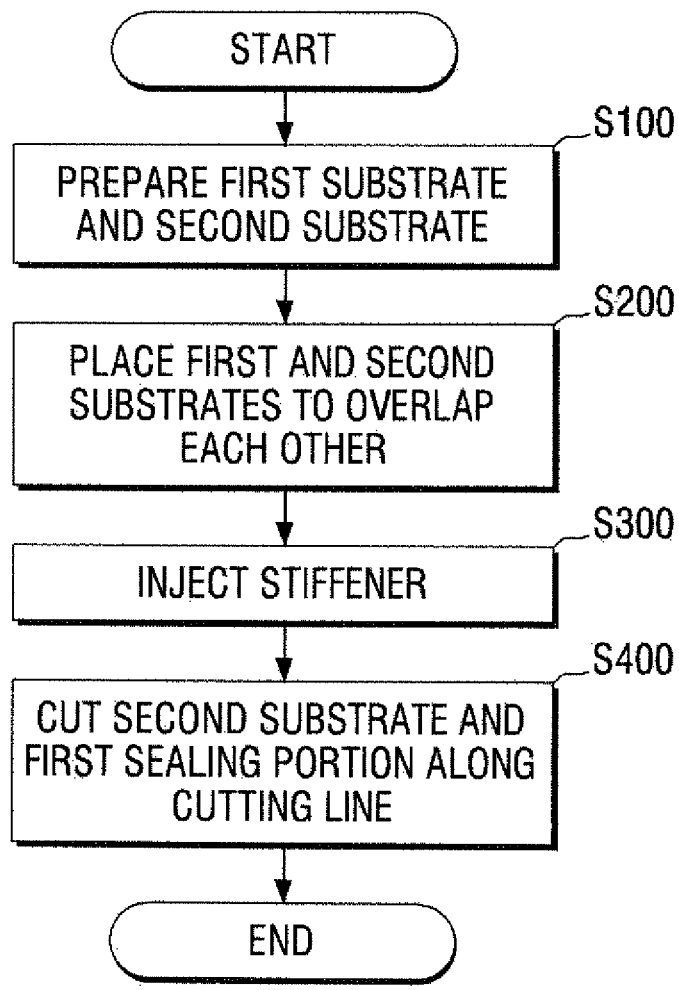
FIG. 13 is a flowchart illustrating a method of fabricating a display apparatus according to various exemplary embodiments of the present invention.
Figure 14:
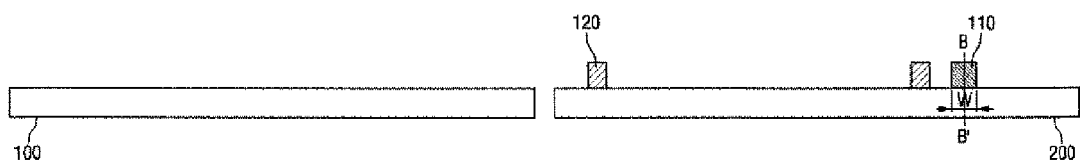
FIGS. 14 thru 16 are cross-sectional views for explaining intermediate processes in the fabrication method of FIG. 13.
Figure 15:
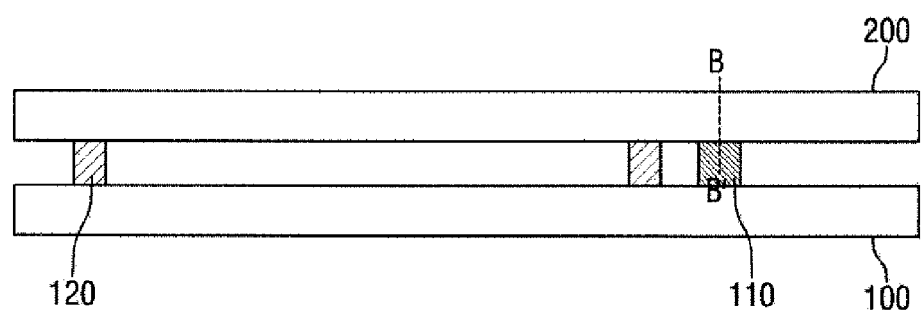
Figure 16:
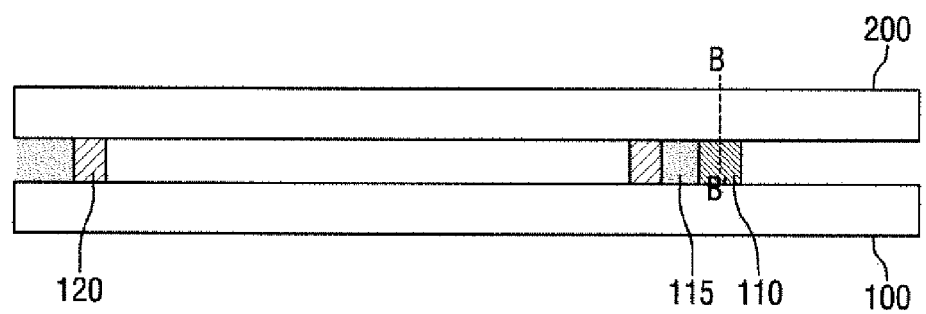

FIG. 13 is a flowchart illustrating a method of fabricating a display apparatus according to various exemplary embodiments of the present invention, and FIGS. 14 thru 16 are cross-sectional views for explaining the fabrication method of FIG. 13.

Referring to FIGS. 13 and 14, a first substrate 100 and a second substrate 200, on which a cutting line B-B' and a first sealing portion 110 are formed, are prepared (operation S100). The first sealing portion 110 has one or more one injection holes 110b (see FIG. 1) and extends along the cutting line B-B'. The first substrate 100 may include display circuits and a peripheral circuit.

The preparing of the second substrate 200 may include defining the cutting line B-B' on the second substrate 200, and forming the first sealing portion 110 having the injection holes 110b (see FIG. 1) along the cutting line B-B'. The injection holes 110b (see FIG. 1) may be created by not forming sealing patterns on some regions of the second substrate 200.

The first sealing portion 110 may be placed in such a manner that a center of a width w of the first sealing portion 110 is situated on the cutting line B-B'. In other words, the first sealing portion 110 may be placed on the second substrate 200 so that it is bisected by the cutting line B-B'. However, the current embodiment is not limited thereto, and the first sealing portion 110 can be placed in any other way, as long as the first sealing portion 110 is situated along the cutting line B-B'.

Optionally, a second sealing portion 120 may be formed on a top surface of the second substrate 200 at the same time as, or separately from, the formation of the first sealing portion 110. In this regard, the second sealing portion 120 may be formed so as to surround a display region of the first substrate 100.

Referring to FIGS. 13 and 15, the second substrate 200 is placed so as to overlap at least part of the first substrate 100 (operation S200).

The second substrate 200 is placed above the first substrate 100 so as to overlap the first substrate 100 such that the first sealing portion 110 is interposed between the first substrate 100 and the second substrate 200. Specifically, the second substrate 200 is placed above the first substrate 100 so that the first sealing portion 110 is interposed between the first substrate 100 and the second substrate 200 but is not attached to the first substrate 100. In this regard, the first sealing portion 110 is not attached to the first substrate 100 in order to prevent the shock created when the second substrate 200 is cut from being delivered to the first substrate 100, thereby avoiding defects (e.g., cracks).

Referring to FIGS. 13 and 16, a stiffener 115 may optionally be injected into the space between the first substrate 100 and the second substrate 200 (operation S300). In this regard, the stiffener 115 may also be injected through the injection holes 110b (see FIG. 1) of the first sealing portion 110. Therefore, the stiffener 115 can be evenly injected into the space, including a region which is in contact with the first sealing portion 110. The injected stiffener 115 increases the adhesion between the first substrate 100 and the second substrate 200, thereby improving the mechanical strength of the display apparatus.

Next, referring to FIGS. 13 and 16, the second substrate 200 and the first sealing portion 110 are cut along the cutting line B-B' (operation S400).

The cutting of the first sealing portion 110 along the cutting line B-B' may denote cutting the first sealing portion 110 in half. The shock created by the cutting of the second substrate 200 may be absorbed by the first sealing portion 110. Therefore, the transmission of the shock to the first substrate 100 can be avoided. In addition, since the first sealing portion 110 is not attached to the first substrate 100, defects (e.g., cracks) of the second substrate 200 can be prevented from being transferred to the first substrate 100.

If the stiffener 115 is not injected between the first substrate 100 and the second substrate 200 before the cutting process (operation S400), the shock created in the cutting process (operation S400) may cause part of the second sealing portion 120, which bonds the first substrate 100 and the second substrate 200 together, to peel or fall off. Since the peeling or falling off of the second sealing portion 120 can weaken the mechanical strength characteristics of the display apparatus, it needs to be prevented in advance.

As described above, the stiffener 115 can be easily injected into a region outside the second sealing portion 120 in which the first sealing portion 110 performing various functions, such as shock absorption and prevention of defect transfer, is not formed. However, it is difficult to sufficiently inject the stiffener 115 into a region between the first sealing portion 110 and the second sealing portion 120 unless the injection holes 110b (see FIG. 1) are formed in the first sealing portion 110, as in the present invention. In the present invention, since the injection holes 110b (see FIG. 1) are formed in the first sealing portion 110 using various methods, the stiffener 115 can be sufficiently injected between the first substrate 100 and the second substrate 200 before the cutting process (operation S400). Therefore, a display apparatus with improved mechanical strength characteristics can be fabricated.

After the second substrate 200 and the first sealing portion 110 are cut, the display apparatus as shown in FIG. 3 is completed. In this regard, the cutting line B-B' may be a boundary A-A' between a first region OR and a second region NOR.

While the method of fabricating the display apparatus according to the exemplary embodiment of FIGS. 1 thru 4 has been described above, display apparatuses according to the above-described other embodiments and their modified embodiments can also be fabricated within the technical spirit of the present invention. Methods of fabricating these display apparatuses can be readily expected by those skilled in the art to which the present invention pertains, and thus a detailed description thereof is omitted.

In a display apparatus according to exemplary embodiments of the present invention, a first sealing portion is situated on a cutting line of a second substrate. Therefore, the shock or defects (e.g., cracks), which may be created when the second substrate is cut, can be prevented from being delivered to a first substrate.

In the display apparatus according to the exemplary embodiments of the present invention, one or more injection holes are formed in the first sealing portion. Therefore, a stiffener can be injected inside the first sealing portion and outside a second sealing portion through the injection holes. The injected stiffener can prevent the second sealing portion from peeling or falling off during the cutting of the second substrate, thereby increasing the mechanical strength of the display apparatus.

However, the effects of the present invention are not restricted to the ones set forth herein. The above and other effects of the present invention will become more apparent to one of ordinary skill in the art to which the present invention pertains by referencing the above disclosure and the claims.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A display apparatus, comprising:
    a first substrate;
    a second substrate separated from the first substrate and facing the first substrate; and
    a first sealing portion interposed between the first substrate and the second substrate;
    wherein the first substrate comprises a first region overlapped by the second substrate and a second region not overlapped by the second substrate, and the first sealing portion is situated on a boundary between the first region and the second region and comprises at least one injection hole;
    said display apparatus further comprising a second sealing portion disposed in the first region of the first substrate between the first substrate and the second substrate and bonding the first substrate and the second substrate together.

2. The display apparatus of claim 1, further comprising a stiffener disposed between the first region of the first substrate and the second substrate and contacting the first sealing portion.

3. The display apparatus of claim 2, wherein the stiffener fills at least part of each of the injection holes.

4. The display apparatus of claim 1, further comprising a stiffener disposed between the first sealing portion and the second sealing portion.

5. The display apparatus of claim 4, wherein the first region of the first substrate comprises a display region in which at least one display circuit is formed, a peripheral circuit is disposed in the second region of the first substrate, and the second sealing portion surrounds the display region.

6. The display apparatus of claim 5, wherein at least one organic light-emitting diode is disposed in the display region.

7. The display apparatus of claim 1, wherein the first sealing portion extends in a direction which is parallel to the boundary.

8. The display apparatus of claim 1, wherein the first sealing portion comprises a plurality of sealing patterns separated from each other, and said at least one injection hole is defined by at least one space between the sealing patterns.

9. The display apparatus of claim 1, wherein said at least one injection hole is partially defined by at least one of a surface of the first substrate and a surface of the second substrate which is exposed by the first sealing portion.

10. The display apparatus of claim 1, wherein the first sealing portion further comprises a sealing member, and said at least one injection hole is disposed inside the sealing member.

11. A display apparatus, comprising:
a first substrate;
a second substrate disposed above the first substrate and overlapping at least part of the first substrate; and
a first sealing portion disposed on the first substrate and having at least one injection hole, an outer surface of the first sealing portion being aligned with a side surface of the second substrate in a first direction;
said display apparatus further comprising a second sealing portion disposed in a first region of the first substrate between the first substrate and the second substrate and bonding the first substrate and the second substrate together.

12. The display apparatus of claim 11, wherein the first region of the first substrate is overlapped by the second substrate and the first substrate comprises a second region not overlapped by the second substrate, and the outer surface of the first sealing portion is aligned with a boundary between the first region and the second region.

13. The display apparatus of claim 12, wherein an inner surface of the first sealing portion is disposed within the first region.

14. The display apparatus of claim 12, further comprising:
a stiffener filling at least part of each said at least one injection hole;
wherein the stiffener is disposed between the first sealing portion and the second sealing portion.

15. The display apparatus of claim 12, wherein the first sealing portion extends in a second direction parallel to the boundary and perpendicular to the first direction.

16. The display apparatus of claim 11, wherein the first sealing portion further comprises a plurality of sealing patterns separated from each other, and said at least one injection hole is defined by at least one space between the sealing patterns.

17. The display apparatus of claim 11, wherein said at least one injection hole is partially defined by at least one of a surface of the first substrate and a surface of the second substrate which is exposed by the first sealing portion.

18. The display apparatus of claim 11, wherein the first sealing portion further comprises a sealing member, and said at least one injection hole is disposed inside the sealing member.

19. A display apparatus, comprising:
a first substrate and a second substrate partially overlapping the first substrate and spaced-apart from the first substrate by a first sealing portion extending along an edge of the second substrate, the first sealing portion being perforated by at least one injection hole located between a first region of the first substrate overlapped by the second substrate and a second region of the first substrate not overlapped by the second substrate; and
a second sealing portion disposed in the first region of the first substrate, the second sealing portion bonding the first substrate together with the second substrate.

20. The display apparatus of claim 19, the stiffener disposed between the first substrate and the second substrate and between the first sealing portion and the second sealing portion.

21. The display apparatus of claim 19, further comprised of said at least one injection hole accommodating insertion of a stiffener between the first substrate and the second substrate.

22. The display apparatus of claim 21, further comprising the stiffener being disposed between the first sealing portion and the second sealing portion.

23. The display apparatus of claim 19, comprised of the first sealing portion disposed between the first region of the first substrate and the second region of the first substrate.

* * * * *